United States Patent [19]
Frese

[11] Patent Number: 4,743,853
[45] Date of Patent: May 10, 1988

[54] NUCLEAR SPIN TOMOGRAPH

[75] Inventor: Georg Frese, Erlangen, Fed. Rep. of Germany

[73] Assignee: Siemens Aktiengesellschaft, Berlin and Munich, Fed. Rep. of Germany

[21] Appl. No.: 742,811

[22] Filed: Jun. 10, 1985

[30] Foreign Application Priority Data

Jul. 2, 1984 [DE] Fed. Rep. of Germany ....... 3424304

[51] Int. Cl.⁴ ............................................. G01R 33/08
[52] U.S. Cl. .................................. 324/320; 324/318; 335/301
[58] Field of Search ................ 324/309, 313, 320–321; 335/301

[56] References Cited

U.S. PATENT DOCUMENTS

| | | | |
|---|---|---|---|
| 3,423,670 | 1/1969 | Parker et al. | 324/320 |
| 3,564,398 | 2/1971 | Nelson | |
| 4,439,733 | 3/1984 | Hinshaw et al. | 324/313 X |
| 4,584,549 | 4/1986 | Brown et al. | 324/320 X |
| 4,590,452 | 5/1986 | Ries et al. | 324/320 X |

OTHER PUBLICATIONS

Hutchison, J. M. S. et al "Human NMR Imaging" in NMR Imaging in Medicine, Kaufman et al eds., Igaku-shoin Publ. N.Y. & Tokyo 1982, p. 107.

Primary Examiner—Michael J. Tokar
Assistant Examiner—Francis J. Jaworski
Attorney, Agent, or Firm—Lawrence C. Edelman

[57] ABSTRACT

The invention relates to a nuclear spin tomograph in which means for the homogenization of the normally present magnetic fields are provided. These means are formed by iron plates (24a, 26a, 28a), whose form, size, arrangement and number are chosen accordingly. The iron plates (24a, 26a, 28a) may be applied parallel to the longitudinal direction of the housing on the housing sides and in star form on one of the end walls (20) of the housing (23).

8 Claims, 2 Drawing Sheets

NUCLEAR SPIN TOMOGRAPH

BACKGROUND OF THE INVENTION

1. Technical Field

The invention relates to the field of nuclear spin tomography devices for the pictorial representation of partial regions from the interior of a test object, and, in particular, to one having coils surrounded by a housing, the coils applying magnetic primary and gradient fields to the test object, having an antenna for picking up the deflection of the atomic nuclei of the test object from their equilibrium position by radio-frequency magnetic excitation pulses, and having means for the homogenization of the magnetic fields.

2. Description of the Prior Art

A nuclear spin tomograph is described in U.S. Pat. No. 3,564,398. This device is suitable for deflecting the hydrogen atom nuclei of the test object and to detect their swinging back into an equilibrium position. Based on the measured signals, the proton distribution of a certain stratum of the test object can be represented pictorially. For good image quality, it is necessary to correct the occurring primary field disturbances. To this end the known apparatus provides a plurality of current-carrying correction coils, so-called shim coils.

SUMMARY OF THE INVENTION

It is the object of the present invention to provide, for the correction of primary field disturbances, that is, for the homogenization of the magnet fields, means which manage without additional currents.

According to the invention, this problem is solved in that on the housing parts associated with the coils, iron plates can be applied in such a way that through a suitable form, size, arrangement and number of iron plates, the magnetic fields are homogenizable. In the apparatus according to the invention, the homogenization of the magnet fields takes place with the aid of iron plate without the need for shim coils or with a reduction of the number of shim coils needed.

An especially simple adjustment is possible if mounts for the iron plates are provided in which the plates can be stacked. A suitable number of iron plates will result in a good homogenization.

For homogenization in x-, y- and z-direction, the iron plates can be applied in stripe form on the long sides of the hollow-cylindrical housing parallel to the longitudinal direction of the cylinder and/or in star form on one of the end walls of the apparatus. If on the outside of the coils magnetic flux returns are arranged in accordance with German Patent Application No. P 33 33 755.1 compensation for the field disturbances caused by these magnetic flux returns is possible by the fact that the iron plates are applied on a housing part surrounding the central opening space, in particular on a plastic tube.

The invention is explained more specifically below with reference to the drawings.

DETAILED DESCRIPTION

Figure 1:
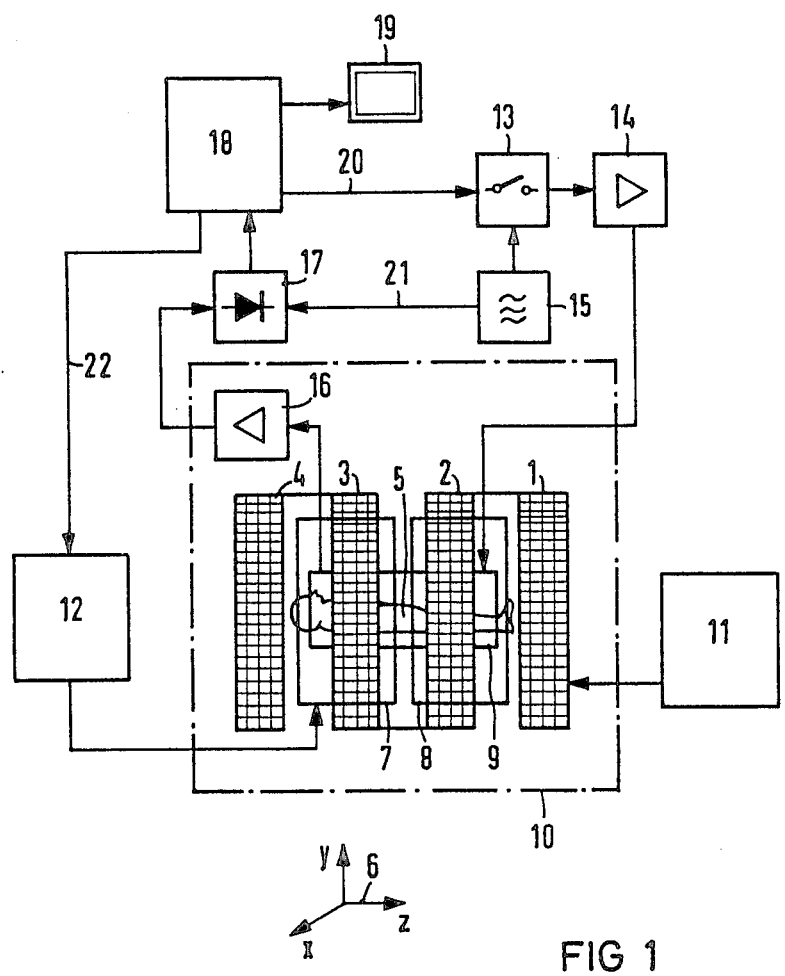
FIG. 1 shows a nuclear spin tomograph to explain the idea of the invention.

In FIG. 1, coils 1 and 2 as well as coils 3 and 4 denote coils for producing a d-c magnetic field $B_0$ in which, for use in medical diagnostics, the body 5 of a patient to be examined is located. With it are associated, in addition, gradient coils which are provided to produce independent magnetic field gradients perpendicular to each other, of the directions x, y and z as indicated at point 6. For greater clarity there have been entered in FIG. 1 only gradient coils 7 and 8 which together with a pair of opposite similar gradient coils serve to produce an x-gradient. The similar y-gradient coils, not shown, lie parallel to the body 5 and above and below it, and those for the z-gradient field lie transversely to its longitudinal axis at the head end and foot end. The arrangement contains in addition an antenna 9 serving to excite the nuclear resonance and to receive the nuclear resonance signals.

The components 1 to 9 framed by a dash-dot line 10 represent the actual exploratory instrument. It is operated by an electrical system which comprises a power supply unit 11 for driving the coils 1 to 4, a gradient current supply 12 to which the gradient coils 7 and 8 and the additional gradient coils are connected. The antenna 9 serving both for excitation and for reception of the signal is connected, on the one hand, via a modulator 13 and a transmitter amplifier 14, to a radio frequency oscillator 15 and, on the other, via a signal amplifier 16 and a phase-sensitive rectifier 17, to a computer processor 18, whence a viewer 19 is supplied. To control the arrangement, there are provided in addition connections 20, 21 and 22 between the computer 18 and modulator 13, between the oscillator 15 and the rectifier 17, and between the computer 18 and gradient current supply 12.

Figure 2:
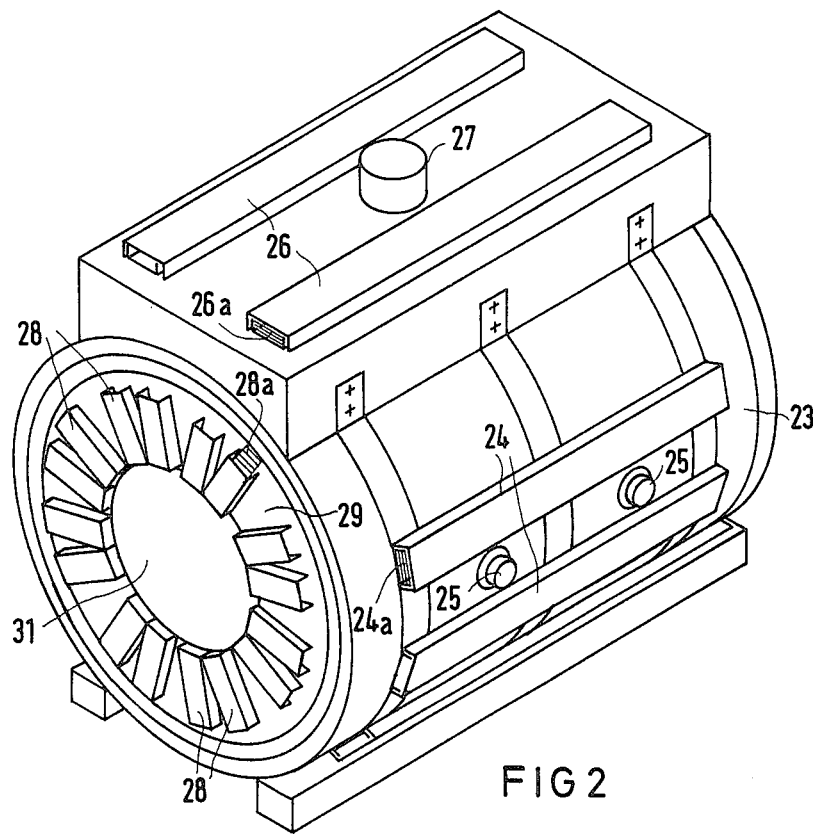
FIGS. 2 and 3 show details of the nuclear spin tomograph according to FIG. 1, having iron plates for magnetic field homogenization.

It is evident from FIG. 2 that the coils 1 to 4 are surrounded by a hollow-cylindrical housing 23, which is filled with liquid helium and liquid nitrogen, so that the coils 1 to 4 are superconductive. For the homogenization of the magnetic fields, mounts for iron plates are provided at the housing 23, in which the plates are stackable. These mounts are formed for the x-direction by two parallel aluminum pockets 24 extending parallel to the longitudinal direction of the hollow-cylindrical housing 23, into which pockets the required number of iron plates 24a can be inserted. In principal, one such aluminum pocket in the center between the pockets 24 is sufficient; the design shown has been selected so that between the two pockets 24, connectors 25 for supply systems can be supply on the housing 23.

For the homogenization of the magnetic field in the y-direction, again, two parallel pockets 26, extending parallel to the longitudinal direction of housing 123 and serving to receive sheetmetal strips 26a, are provided on the top side of housing 23. The tower 27 on the top of housing 23 serves to supply the apparatus with liquefied gases and with electric power. Lastly, the homogenization of the magnetic field in the z-direction occurs by sheet metal strips lying in pockets 28 and on the end face 29 of housing 23. The pockets 28, like the pockets 24 and 26, may consist of aluminum sheet; preferably their arrangement is star-shaped or ring-shaped on the end face 29.

Depending on the particular gradient pattern, the pockets 28 are provided on the end face 29 or on the opposite end face of housing 23, the pockets 26 on the top side or on the opposite bottom side, and the pockets 24 on the right or on the opposite left side of housing 23.

Figure 3:
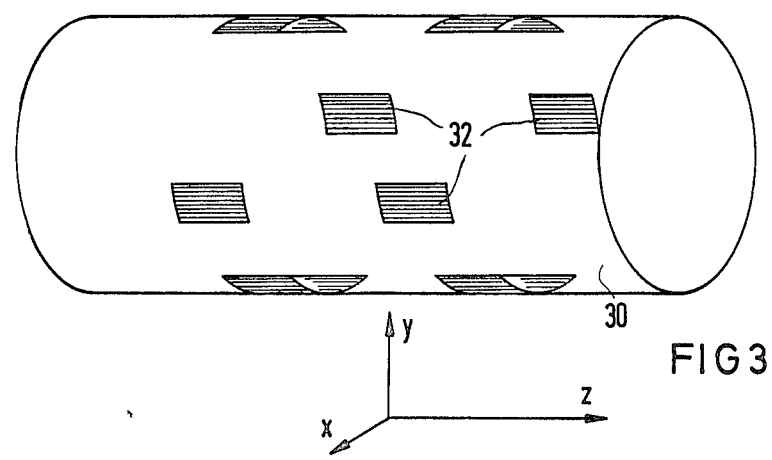

FIG. 3 shows a plastic tube 30 which is insertable into the housing 23, namely into the central opening 31 thereof. If, in accordance with German Patent Application No. P 33 33 755.1, magnetic flux returns of iron are provided at the housing 23, a number of iron plates 32, which too may lie in pockets, may be attached to the inside of the plastic tube 30 in the manner illustrated in FIG. 3, to compensate the inhomogeneities produced thereby.

The iron plates stackable in the pockets 24, 26 and 28 are in part shown schematically in FIG. 2 and designated by 24a, 26a, 28a. By appropriate selection of the form, size, arrangement and number of these iron plates 24a, 26a, 28a and also of the iron plates 32 (FIG. 3), a homogenization of the magnetic fields within the desired accuracy is possible.

What is claimed is:

1. A nuclear spin tomograph device for the analysis of partial regions from the interior of a test object, the device comprising a housing for receiving said test object therein, coils surrounded by said housing, said coils applying magnetic primary and gradient fields to the test object, an antenna means positioned inside said housing for transmitting radio frequency magnetic excitation pulses toward said test object and for receiving signals representing a deflection of the atomic nuclei of the test object from their equilibrium position, said deflection caused by the radio-frequency magnetic excitation pulses, data processing means connected to said antenna for analysing the signals received by the antenna, and means for homogenizing the magnetic primary field, said homogenization means comprising a plurality of iron plates applied on parts of the housing surrounding the coils, the iron plates being of predetermined form, size, arrangement and number so as to homogenize said primary magnetic field within a desired degree of accuracy, the plates requiring no application of electrical currents.

2. A nuclear spin tomograph device according to claim 1, wherein the homogenization means comprises mounts on the housing parts for the iron plates, in which mounts the plates are stackable.

3. A nuclear spin tomograph device according to claim 2, wherein the mounts comprise parallel aluminum pockets.

4. A nuclear spin tomograph device according to claim 1, wherein the iron plates are applied in a star form on an end wall of the housing of the device.

5. A nuclear spin tomograph device according to claim 1, wherein the housing is in he shape of a hollow cylinder, the iron plates being applied in a strip form on long sides of the hollow-cylindrical housing of the device, and in parallel to the longitudinal direction of the housing.

6. A nuclear spin tomograph device according to claim 1, wherein at least some of the iron plates are applied on a housing part surrounding a central opening space of the housing.

7. A nuclear spin tomograph device, according to claim 6, wherein the at least some of said iron plates are applied on a housing part comprising a plastic tube inserted into the central opening space of the housing.

8. A nuclear spin tomograph device according to claim 7, wherein the at least some iron plates are applied on an inner surface of the plastic tube.

* * * * *